United States Patent
Tanji et al.

[19]

[11] Patent Number: 6,037,841
[45] Date of Patent: Mar. 14, 2000

[54] IMPEDANCE MATCHED CMOS TRANSIMPEDANCE AMPLIFIER FOR HIGH-SPEED FIBER OPTIC COMMUNICATIONS

[75] Inventors: Todd M. Tanji, Egan, Minn.; John J. Stronczer, Mattawan, Mich.

[73] Assignee: Applied Micro Circuits Corporation, San Diego, Calif.

[21] Appl. No.: 09/168,027

[22] Filed: Oct. 7, 1998

Related U.S. Application Data

[60] Provisional application No. 60/061,318, Oct. 7, 1997.

[51] Int. Cl.[7] ............................... H03F 3/08; H01J 40/14
[52] U.S. Cl. ..................................... 330/308; 250/214 A
[58] Field of Search .......................... 330/308; 250/214 A

[56] References Cited

U.S. PATENT DOCUMENTS

| | | | |
|---|---|---|---|
| 4,772,859 | 9/1988 | Sakai | 330/308 |
| 4,998,012 | 3/1991 | Kruse | 250/214 A |
| 5,202,553 | 4/1993 | Geller | 250/214 A |
| 5,253,096 | 10/1993 | Freeman et al. | 359/184 |
| 5,347,389 | 9/1994 | Skrobko | 330/308 |
| 5,742,205 | 4/1998 | Cowen et al. | 330/269 |
| 5,761,225 | 6/1998 | Fidric et al. | 372/6 |

*Primary Examiner*—Robert Pascal
*Assistant Examiner*—Patricia T. Nguyen
*Attorney, Agent, or Firm*—Gray Cary Ware Freidenrich

[57] ABSTRACT

A transimpedance amplifier according to the present invention is designed for high-speed fiber optic communications. The transimpedance amplifier preferably includes an input stage, a second stage and a bias generator. The input stage is operably coupled to the second stage and has an input impedance. The second stage has an output impedance. The bias generator is operably coupled to the input stage and the second stage, and operates to bias the input stage and second stage such that the input impedance substantially matches the output impedance. In this manner, the input and output impedances of a transimpedance amplifier of a fiber optics communication receiver are controllable to a desired impedance for interfacing with a transmission line.

19 Claims, 2 Drawing Sheets

IMPEDANCE MATCHED CMOS TRANSIMPEDANCE AMPLIFIER FOR HIGH-SPEED FIBER OPTIC COMMUNICATIONS

CROSS-REFERENCE TO RELATED APPLICATION

This application claims priority under 35 USC §119 to U.S. patent application Ser. No. 60/061,318, filed Oct. 7, 1997, which is incorporated herein by reference.

BACKGROUND OF THE INVENTION

1. Field of the Invention

This invention relates to fiber optic communication, and more particularly, to transimpedance amplifiers used in formatting fiber optic communication data.

2. Description of Related Art

Low-cost, high-performance, highly integrated fiber optic interface circuits are becoming increasingly necessary to meet the demands of high-speed digital data communication. With the advent of Gigabit Ethernet systems, for example, fiber optic technology has become increasingly preferred. One standard circuit function for fiber optic communication systems is a transimpedance amplifier that is used within an optical receiver. Transimpedance amplifiers are employed in optical receivers in order to convert very small currents indicative of optical signals applied to photodiode detectors. These small currents are then converted to signal voltages of greater amplitude. In an optical fiber communications network where a plurality of geographically distributed users each write onto a common optical fiber, incoming optical signals from a nearby transmitter may be detected at a high signal level, whereas incoming optical signals from a distant transmitter may be detected at very low signal levels. As such, to be effective, a transimpedance amplifier desirably should be able to detect all levels of signals and transmit these signals without loss of signal bandwidth to components that are physically distinct from the transimpedance amplifier.

SUMMARY OF THE INVENTION

To achieve the above desires, a transimpedance amplifier according to the present invention is designed for high-speed fiber optic communications. The transimpedance amplifier preferably includes an input stage, a second stage and a bias generator. The input stage is operably coupled to the second stage and has an input impedance. The second stage has an output impedance. The bias generator is operably coupled to the input stage and the second stage and operates to bias the input and second stage such that the input impedance substantially matches the output impedance. In this manner, the input and output impedances of a transimpedance amplifier of a fiber optics communication receiver are controllable to a desired impedance for interfacing with a transmission line.

DETAILED DESCRIPTION OF PREFERRED EMBODIMENTS

Figure 1:
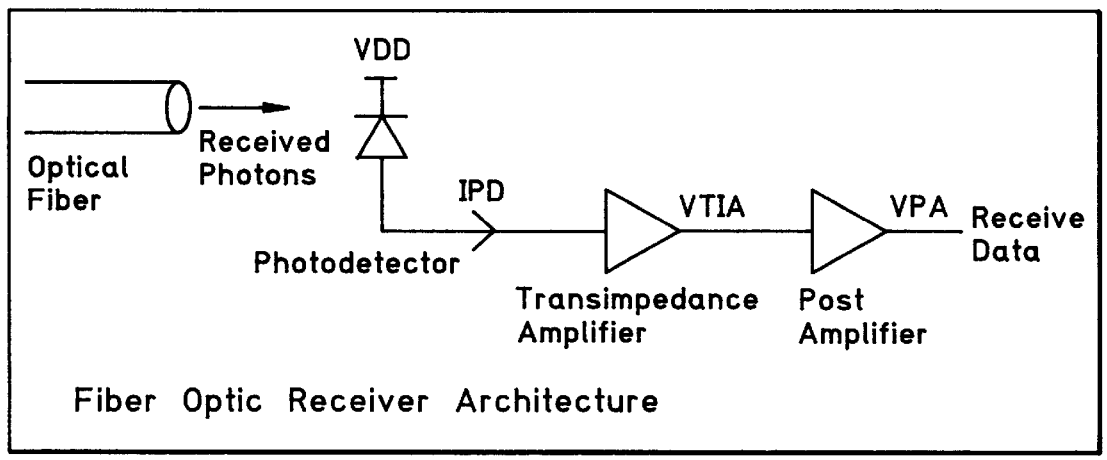
FIG. 1 depicts a fiber optic receiver architecture utilizing a transimpedance amplifier.

A typical fiber optic receiver, as shown in FIG. 1, generally comprises a photodetector, transimpedance amplifier and post amplifier. The photodetector converts optical energy, in the form of photons from an optical fiber, into electrical energy. The output of the photodetector is an electrical current, IPD, that is proportional to the received optical power. The transimpedance amplifier converts the photodetector current into an output voltage, VTIA. The post amplifier amplifies the transimpedance amplifier output a level, VPA, which can be processed by a digital clock and data recovery circuit. Such a digital clock and data recovery circuit is disclosed in co-pending U.S. patent application Ser. No. 60061319, entitled CLOCK AND DATA RECOVERY SCHEME FOR MULTI-CHANNEL DATA COMMUNICATIONS RECEIVERS, filed on even date herewith which is incorporated herein by reference.

Figure 2:
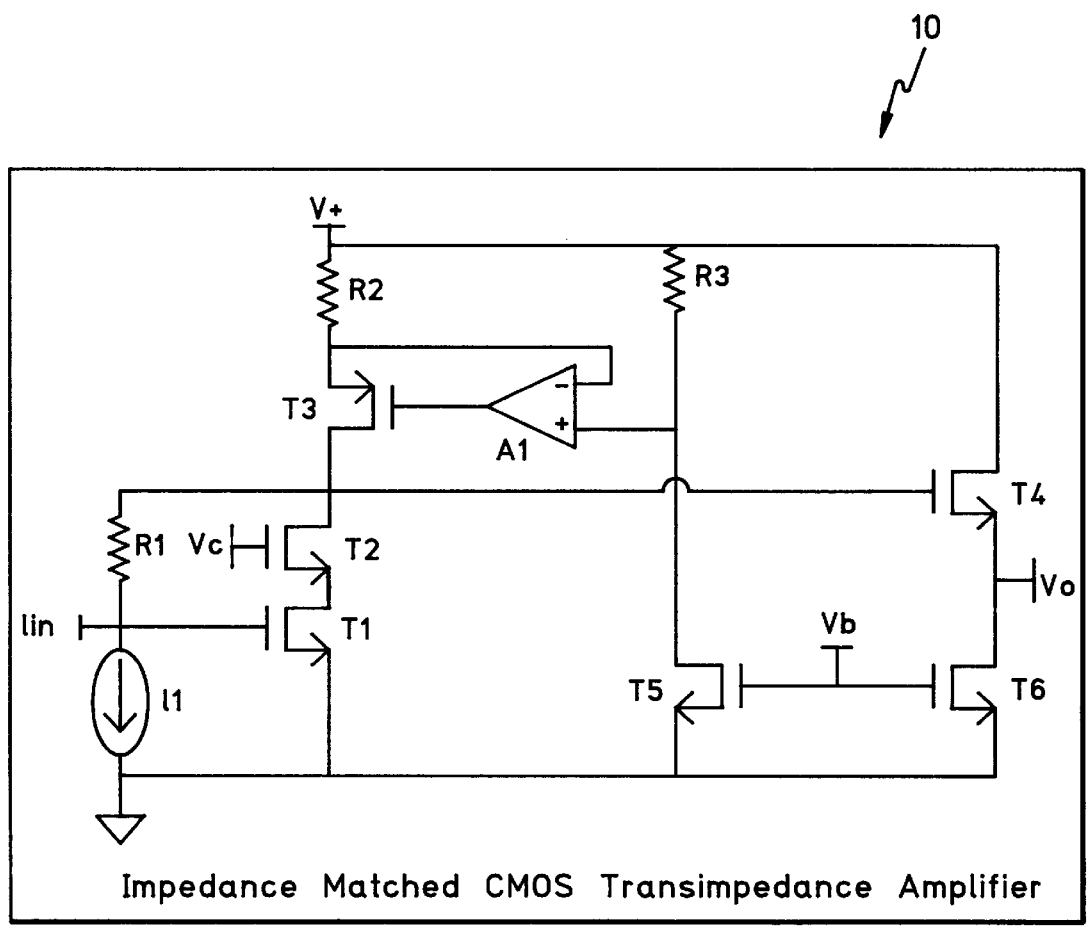
FIG. 2 is a schematic diagram of an impedance matched CMOS transimpedance amplifier according to an embodiment of the present invention.

Referring to FIG. 2, one embodiment of an impedance matched CMOS transimpedance amplifier 10 according to the present invention may be appreciated. Current input $I_{in}$ into transimpedance amplifier 10 is tied to the gate of transistor T1. $I_{in}$ is preferably less than 10 mA for low power dissipation.

The source of transistor T1 is tied to ground while the drain is connected to the source of a transistor T2. Voltage $V_c$ is connected to the gate of transistor T2 and the drain of the same transistor T2 is tied to the drain of transistor T3. The source of transistor T3 is connected to the negative input of amplifier A1 and to resistor R2. A positive voltage supply, V+ (3.3 volts in the preferred embodiment), is also connected to resistor R2 as well as resistor R3 and the drain of transistor T4. Resistor R3 is tied to the drain of transistor T5, whose source is connected to ground, and resistor R3 is also connected to the positive input of amplifier A1.

The source of transistor T4 is connected to the output voltage port $V_o$ and the drain of transistor T6. The source of transistor T6 is tied to ground. Both the gate of transistor T5 and transistor T6 are connected to gate voltage $V_b$. The gate of transistor T4 is connected to resistor R1, which is in turn connected to current source I1. The first input stage of transimpedance amplifier 10 incorporates components T1, T2 and R1, the second stage of transimpedance amplifier 10 incorporates components T4 and T6, while the remainder of the components of FIG. 2 namely, T3, R2, R3, A1 and T5, make up the biasing portion of transimpedance amplifier 10.

The first input stage of the transimpedance amplifier is biased with a low capacitance p-channel current source circuit, which provides for a large effective bandwidth. The large bandwidth is determined by system considerations. For example, an optimum bandwidth for a no-return-to-zero digital receiver is 0.7 times the data rate, e.g. for a data rate of 1.25 Gbits per second, the optimum bandwidth is 875 MHz. Excessive bandwidth allows increased thermal noise without a corresponding amplification of the signal. Too little bandwidth results in increased jitter due to inadequate settling time. As such, the bandwidth of the transimpedance amplifier of the present invention has a bandwidth of preferably greater than 1 GHz to accommodate the bandwidth limitations of a receivers photodetector and post amplifier.

In the embodiment illustrated in FIG. 2, the input current is received at port $I_{in}$ while the output voltage is transmitted at port $V_o$. Power is supplied to the circuit at V+. Transistor T1 preferably is an n-channel transistor and is configured as a common source amplifier. Transistor T1 preferably is cascoded by transistor T2 to isolate the input from the Miller capacitance effect (too much capacitance will result in an undesirable lowering of the signal-to-noise ratio). Resistor R1 preferably is a feedback resistor and operates to configure the overall transimpedance amplifier 10 as an inverting low-input impedance amplifier. The transimpedance preferably is equal to R1. The input impedance is defined as follows:

$$\text{input impedance} = \frac{R1}{1 + gm1 * R1} \quad (1)$$

where gm1 is the transconductance of T1. If gm1*R1>>1, the input impedance may be defined as:

$$\text{input impedance} = \frac{1}{gm1} \quad (2)$$

The input impedance, which is preferably less than 100 ohms, in this embodiment is preferably controlled to 50 ohms by bias circuit 20, described below.

Note that current source I1 forces a voltage drop across feedback resistor R1. This allows sufficient voltage drop from drain to source of cascoded transistor T2 for operation in saturation.

The output of transimpedance amplifier 10 at $V_{out}$ preferably is buffered by transistor T4 operating as a source follower of current source transistor T6. The output impedance, if gm4*R4>>1, may be defined as:

$$\text{output impedance} = \frac{1}{gm4} \quad (3)$$

where gm4 is the transconductance to T4. Biasing circuit 20 also controls the output impedance to 50 ohms.

Transistor T1 is biased through a circuit preferably comprising p-channel transistor T3, resistors R2 and R3, operational amplifier A1 and transistor T5. Transistor T5 generates a reference current. Resistor R3 converts the reference current to a reference voltage. Amplifier A1 and transistor T3 force this reference voltage across resistor R2, which converts the reference voltage to a bias current for transistor T1. This allows for the smallest size of transistor T3 needed to reduce the load capacitance of the first input stage and provide the highest bandwidth operation.

Figure 3:
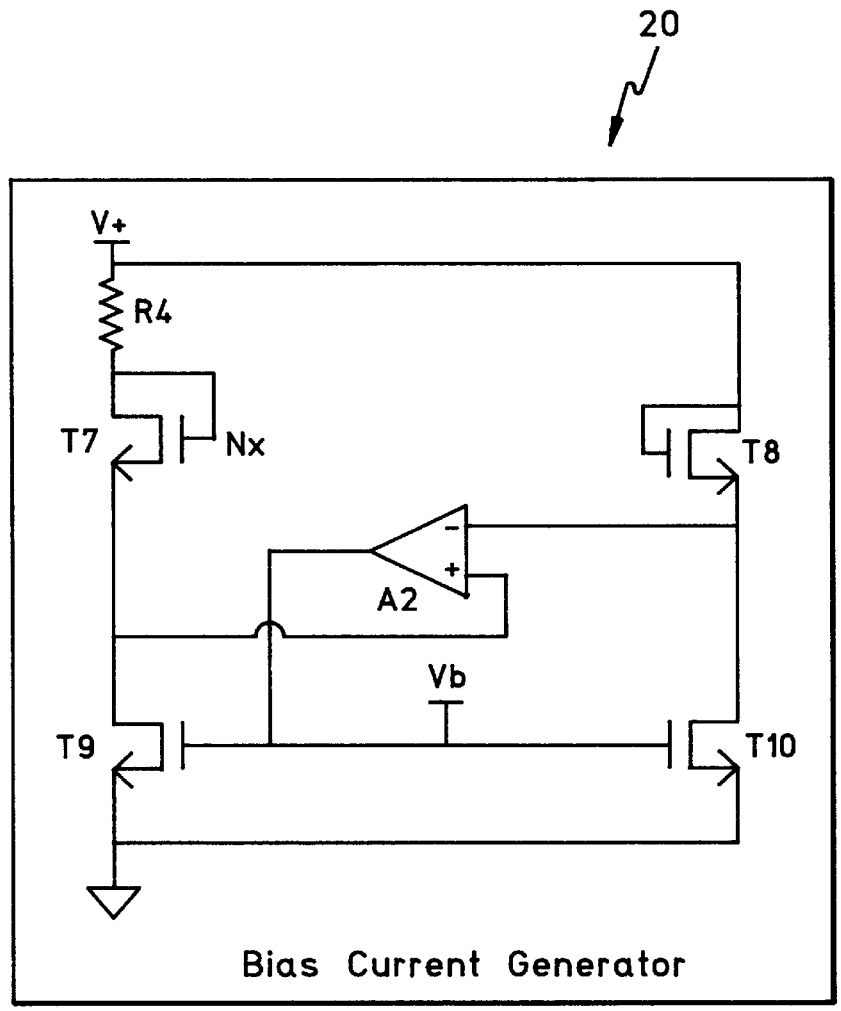
FIG. 3 is a schematic diagram of a bias current generator according to an embodiment of the present invention.

Referring to FIG. 3, one embodiment of bias generator circuit 20 of impedance matched CMOS transimpedance amplifier 10 may now be appreciated. The drain of transistor T7 is tied to the gate of transistor T7 and to resistor R4. Resistor R4 is connected to power supply V+. Transistor T8 has its drain tied to gate and also to resistor R4 and power supply V+. The source of transistor T8 is connected to the negative input of amplifier A2. The positive input of amplifier A2 is connected to the source of transistor T7 and to the drain of transistor T9. The source of transistor T9 is tied to the source of transistor T10. The drain of transistor T10 is connected to the source of transistor T8 and to the negative input of amplifier A2. The output of amplifier A2 and gate voltage $V_b$ are connected to the gates of transistor T9 and transistor T10. Note that the circuit of FIG. 3 is connected to the circuit of FIG. 2 at $V_b$.

In operation, bias generator circuit 20 preferably biases n-channel transistors T1, T4, T7 and T8 so that their transconductance is inversely proportional to reference resistor R4. To explain, the drain current, Id, in a MOS transistor is given by:

$$Id = K(Vgs-Vt)^2 \quad (4)$$

where:
Vgs is the gate to source voltage,
Vt is the threshold voltage and
K is a process dependant constant.

The small signal transconductance is given by:

$$Gm = \sqrt{K(Id)} \quad (5)$$

Operational amplifier A2 holds the source nodes of T7 and T8 to be equal so that:

$$Vgs7 + Id7*R4 = Vgs6 \quad (6)$$

and T9 and T10 hold the drains of T7 and T8 to be equal so that Id7=Id8. Substituting equation 5 into 4, then substituting 4 into 6 and solving for Gm yields $$gm8 = \frac{2*(1-\sqrt{N})}{R4} \quad (7)$$

where N is the transistor aspect ratio between transistor T7 and transistor T8. In this manner, the transistors' transconductance and, hence, the input and output impedances of transimpedance amplifier 10 are preferably controlled to 50 ohms. These controlled input and output impedances allow for easy transmission line interfacing (50 ohms is a standard transmission line impedance) and routing of input and output signals to components, such as a photodetector or post amplifier, which are physically distant (e.g. greater than 10 mm) via a microstrip line on a printed circuit board from the transimpedance amplifier without distortion. Distortion may occur through loss of signal bandwidth and/or through signal reflections.

Gate voltage $V_b$ is preferably used in the transimpedance amplifier 10 to replicate the bias current from bias current generator 20. While the circuit of FIG. 3 is the preferred biasing circuit for transimpedance amplifier 10 as it provides stability over the amplifier's operating parameters, other biasing circuits may be used without departing from the spirit or scope of the invention.

Figure 4:
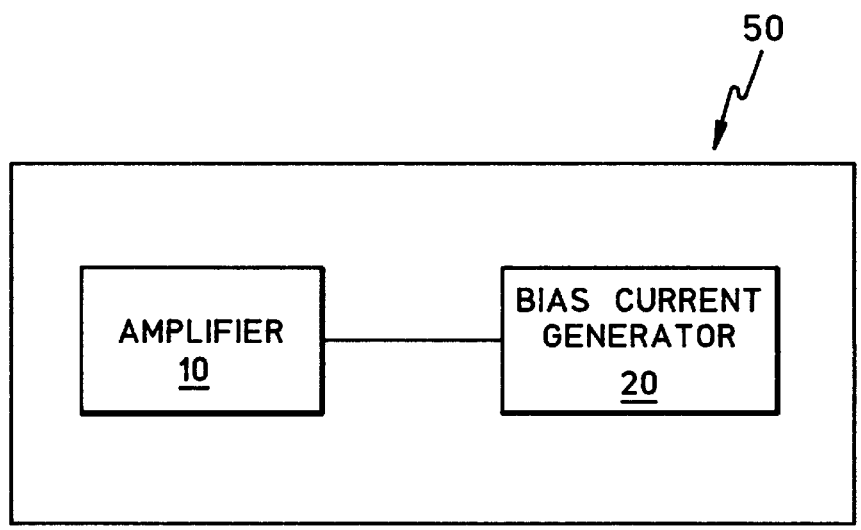
FIG. 4 is a schematic illustration of an integrated circuit containing the transimpedance amplifier of the present invention.

Embodiments of impedance matched transimpedance amplifier 10 preferably are implemented entirely with a low cost integrated circuit (IC) process. An example of an integrated circuit 50 containing impedance matched transimpedance amplifier 10 is illustrated schematically in FIG. 4. It should be noted that integrated circuit 50 may include one or more of the circuits embodying the present invention. In addition, integrated circuit 50 may also include other related circuitry not shown. Ideally, the transimpedance amplifier is implemented using complementary metal oxide semiconductor (CMOS) technology. CMOS technology is a relatively low cost IC process due to its present use in high volume computer applications. However, gallium arsenide or FET technology may be used, with appropriate considerations, without departing from the spirit or scope of the invention.

The present invention may be embodied in other specific forms without departing from the spirit of the essential attributes thereof; therefore, the illustrated embodiments should be considered in all respects as illustrative and not restrictive, reference being made to the appended claims rather than to the foregoing description to indicate the scope of the invention.

What is claimed:

1. A transimpedance amplifier for use in a fiber optic receiver, said transimpedance amplifier comprising:
   an input stage having an input impedance;
   a second stage operably connected to said input stage and having an output impedance; and
   a bias generator operably connected to said input stage and to said second stage, wherein said bias generator biases said input stage and said second stage such that said input impedance substantially matches said output impedance.

2. The amplifier of claim 1, further comprising a biasing circuit, said biasing circuit being operably connected to said input stage and to said second stage.

3. The amplifier of claim 2, wherein said biasing circuit provides a bias current for said input stage.

4. The amplifier of claim 1, wherein said bias generator substantially fixes said input impedance and said output impedance to a desired value for transmission line interfacing.

5. The amplifier of claim 4, wherein said desired value is less than 100 ohms.

6. The amplifier of claim 4, wherein said desired value is about 50 ohms.

7. The amplifier of claim 5, wherein said input stage is biased with a low capacitance, p-channel current source circuit.

8. The amplifier of claim 1, wherein said transimpedance amplifier is fabricated using CMOS technology.

9. A fiber optic receiver comprising:
   a detector wherein said detector detects optical energy from an optical fiber and produces an output representative of the detected optical energy; and
   a transimpedance amplifier, wherein said transimpedance amplifier comprises:
      an input stage, wherein said input stage receives said output and wherein said input stage has an input impedance;
      a second stage operably coupled to said input stage and having an output impedance; and
      bias generating means operably coupled to said input stage and said second stage, wherein said bias generating means biases said input stage and said second stage such that said input impedance substantially matches said output impedance.

10. The fiber optic receiver of claim 9, further comprising a post amplifier operably coupled to said transimpedance amplifier.

11. The fiber optic receiver of claim 9, wherein said bias generating means substantially fixes said input impedance and said output impedance to a desired value for transmission line interfacing.

12. The fiber optic receiver of claim 11, wherein said value is less than 100 ohms.

13. The fiber optic receiver of claim 9, wherein said input stage is biased with a low capacitance, p-channel current source circuit.

14. The fiber optic receiver of claim 11 wherein said value is about 50 ohms.

15. The fiber optic receiver of claim 9, wherein said transimpedance amplifier is fabricated using CMOS technology.

16. A transimpedance amplifier for use in a fiber optic receiver, said transimpedance amplifier comprising:
   an input stage including a first transistor and a second transistor operably coupled to said first transistor, wherein said input stage has an input impedance defined by a transconductance of said first transistor;
   a second stage operably coupled to said input stage, said second stage including a third transistor and a fourth transistor operably coupled to said third transistor, wherein said second stage has an output impedance defined by a transconductance of said third transistor; and
   a bias generator operably coupled to said input stage and said second stage, wherein said bias generator biases said input stage and said second stage to substantially fix said input impedance and said output impedance to a same desired value.

17. The amplifier of claim 16, wherein said desired value is selected for transmission line interfacing.

18. The amplifier of claim 17, wherein said desired value is less than 100 ohms.

19. The amplifier of claim 17, wherein said desired value is about 50 ohms.

* * * * *